(12) United States Patent
Jeon

(10) Patent No.: US 10,014,811 B2
(45) Date of Patent: Jul. 3, 2018

(54) APPARATUS FOR CORRECTING CURRENT REFERENCE

(71) Applicant: LSIS CO., LTD., Anyang-si, Gyeonggi-do (KR)

(72) Inventor: Mi-Rim Jeon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 11 days.

(21) Appl. No.: 15/383,275

(22) Filed: Dec. 19, 2016

(65) Prior Publication Data

US 2017/0288591 A1    Oct. 5, 2017

(30) Foreign Application Priority Data

Apr. 1, 2016   (KR) .................. 10-2016-0040095

(51) Int. Cl.
*H02P 27/06*   (2006.01)
*H02P 21/04*   (2006.01)
(Continued)

(52) U.S. Cl.
CPC .............. *H02P 25/02* (2013.01); *G01R 19/25* (2013.01); *H02P 21/04* (2013.01); *H02P 21/14* (2013.01); *H02P 27/06* (2013.01)

(58) Field of Classification Search
CPC ...... H02P 27/06; H02P 27/12; H02P 2205/00; H02P 21/20
See application file for complete search history.

(56) References Cited

U.S. PATENT DOCUMENTS 5,689,169 A * 11/1997 Kerkman ................ H02P 21/16
                                                                 318/772
6,335,605 B1 * 1/2002 Negoro .................... H02P 21/10
                                                                 318/727
(Continued)

FOREIGN PATENT DOCUMENTS

CN      103378788 A    10/2013
CN      103532462 A     1/2014
(Continued)

OTHER PUBLICATIONS

European Search report dated Jul. 10, 2017 issued in corresponding European Application No. 16204133.9.
(Continued)

*Primary Examiner* — Eduardo Colon Santana
*Assistant Examiner* — Said Bouziane
(74) *Attorney, Agent, or Firm* — K&L Gates LLP

(57) ABSTRACT

The present disclosure relates to an apparatus for correcting a current reference, and more particularly, to an apparatus for correcting a current reference including a calculation unit configured to set a first torque reference section and a second torque reference section using candidate values of a correction factor that corrects the current reference so as to enable the current reference to satisfy rated operating conditions of the induction machine, and calculate the correction factor according to a section, in which the torque reference is included, of the first torque reference section and the second torque reference section, and a correction unit configured to correct the current reference using the correction factor.

4 Claims, 4 Drawing Sheets

(51) Int. Cl.
*H02P 25/02* (2016.01)
*H02P 21/14* (2016.01)
*G01R 19/25* (2006.01)
*H02P 27/12* (2006.01)
*H02P 21/20* (2016.01)

(56) References Cited

U.S. PATENT DOCUMENTS

| | | | |
|---|---|---|---|
| 2001/0052756 A1* | 12/2001 | Noro | B62D 5/0463 318/432 |
| 2005/0065690 A1* | 3/2005 | Ashizawa | B60K 6/48 701/51 |
| 2006/0012322 A1* | 1/2006 | Matsumoto | H02P 5/74 318/432 |
| 2006/0066275 A1* | 3/2006 | Thunes | H02P 21/10 318/432 |
| 2013/0009572 A1 | 1/2013 | Byun | |
| 2014/0285125 A1 | 9/2014 | Kato | |
| 2015/0158502 A1* | 6/2015 | Nappo | B60L 15/025 105/73 |
| 2015/0326162 A1* | 11/2015 | Yoo | H02P 21/0035 318/801 |

FOREIGN PATENT DOCUMENTS

| | | |
|---|---|---|
| EP | 2 343 799 A1 | 7/2011 |
| EP | 2 945 280 A2 | 11/2015 |
| JP | 2001352793 A | 12/2001 |
| JP | 2003-284399 A | 10/2003 |
| JP | 2016-032328 A | 3/2016 |
| KR | 10-0795283 B1 | 1/2008 |
| KR | 10-1046042 B1 | 7/2011 |
| KR | 10-1053315 B1 | 8/2011 |
| WO | 2008/004316 A1 | 1/2008 |

OTHER PUBLICATIONS

Office Action dated Aug. 22, 2017 issued in corresponding Japanese Application No. 2016-242652.
KR office action dated Dec. 22, 2016 for counterpart KR application No. 10-2016-0040095.

* cited by examiner

APPARATUS FOR CORRECTING CURRENT REFERENCE

CROSS REFERENCE TO RELATED APPLICATION

This application claims the benefit of Korean Patent Application No. 10-2016-0040095, filed on Apr. 1, 2016, entitled "APPARATUS FOR CORRECTING CURRENT REFERENCE", which is hereby incorporated by reference in its entirety into this application.

BACKGROUND

1. Technical Field

The present disclosure relates to an apparatus for correcting a current reference, and more particularly, to an apparatus for correcting a current reference, which is capable of setting a first torque reference section and a second torque reference section using candidate values of a correction factor for correcting a current reference, and correcting the current reference by calculating the correction factor according to a section in which a torque reference is included.

2. Description of the Related Art

Generally, an induction machine is configured with a stator on which a winding is mounted and a rotor formed of an aluminum conductor or an iron core. Such an induction machine is a device for obtaining rotational power by generating periodic current variation at the winding mounted on the stator to induce torque at the rotor by means of variation of a magnetic field according to the current variation.

A general-purpose inverter is mainly used in driving of a three-phase electric motor, and specifically, is commonly used in a variable speed driving field using an induction machine, a hoisting load, or a traction load of an electric vehicle. The induction machine is mainly driven through a vector control or a field oriented control (FOC), and a position sensorless vector control is widely used as a control method of the induction machine when a space is restricted or in a field in which a cost reduction of a system is necessary.

Specifically, in a torque mode of a vector control having torque as a reference in a state in which a position sensor is not used, the position sensorless vector control is applied to control the torque. However, because an estimated value of magnetic flux is lower in accuracy than magnetic flux information obtained through a position sensor even though the position sensorless vector control is applied thereto, there is a problem in that a driving of an inverter is unstable at low speed domain and at low torque domain.

As a result, to improve unstable driving performance in a sensorless torque mode of a conventional technique, a magnitude of a magnetic flux current is varied according to a driving condition to increase a slip frequency of the induction machine such that accuracy of an estimated value of magnetic flux is improved.

At this point, in varying the magnitude of the magnetic flux current in the conventional technique, a correction factor is calculated according to limited conditions required in the driving of an inverter and an induction machine and the magnitude of the magnetic flux current is varied using the calculated correction factor so that unstable driving performance of a sensorless torque mode is improved.

However, because the correction factor should be calculated by performing an arithmetic operation on an equation to which complicated and various limited conditions are applied in the conventional technique, there are problems in that high performance operation processing ability for calculating the complicated equation is required and an arithmetic operation time takes more owing to a large computation amount.

SUMMARY

An object of the present disclosure is to correct a current reference by setting a first torque reference section and a second torque reference section using candidate values of a correction factor for correcting a current reference, and calculating the correction factor based on a minimum value among the candidate values of the correction factor satisfying a minimum excitation current condition of the induction machine when a torque reference is included in the first torque reference section, and the correction factor in proportion to the torque reference when the torque reference is included in the second torque reference section.

To attain the above described object, an apparatus for correcting a current reference includes a calculation unit configured to set a first torque reference section and a second torque reference section using candidate values of a correction factor that corrects the current reference so as to enable the current reference to satisfy rated operating conditions of the induction machine, and calculate the correction factor according to a section, in which the torque reference is included, of the first torque reference section and the second torque reference section, and a correction unit configured to correct the current reference using the correction factor.

In accordance with the present disclosure as described above, the correction factor is calculated from a minimum value among the candidate values of the correction factor satisfying a minimum excitation current condition of the induction machine when the torque reference is included in the first torque reference section, whereas the correction factor is calculated in proportion to the torque reference when the torque reference is included in the second torque reference section so that there is an effect in which the correction factor satisfying the rated operating conditions of the induction machine may be rapidly calculated with low computing power.

DETAILED DESCRIPTION

Figure 1:
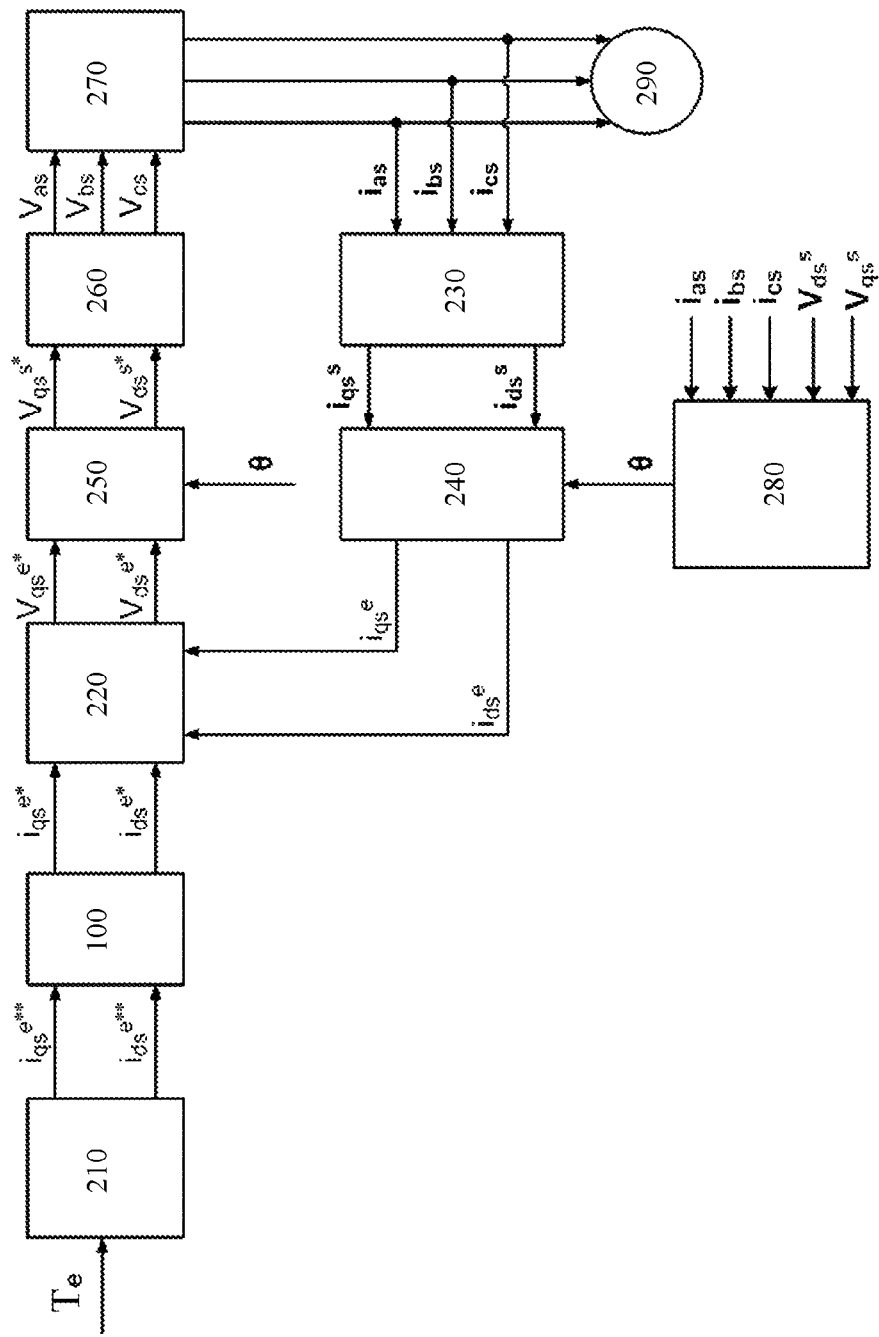
FIG. 1 is a diagram illustrating a current reference correction apparatus and an induction machine system according to one embodiment of the present disclosure.

The above and other objects, features and advantages of the present disclosure will be described in detail below with reference to the accompanying drawings, and thus the technical spirit of the present disclosure can be easily implemented by those skilled in the art. In the following description of the present disclosure, if a detailed description of known configurations and functions is determined to obscure the interpretation of embodiments of the present disclosure, the detailed description thereof will be omitted. Hereinafter, preferred embodiments according to the present disclosure will be described in detail with reference to the accompanying drawings. In the drawings, the same reference numerals refer to the same or similar elements throughout.

FIG. 1 is a diagram illustrating a current reference correction apparatus 100 and an induction machine system according to one embodiment of the present disclosure.

Referring to FIG. 1, the current reference correction apparatus 100 according to one embodiment of the present disclosure may be included in the induction machine system.

Also, the induction machine system includes a current reference generation unit 210, a current controller 220, a two-phase current converter 230, a current resolver 240, a voltage resolver 250, a three-phase voltage converter 260, an inverter 270, a rotor speed and position estimator 280, and an induction machine 290.

At this point, the induction machine system may control torque through a sensorless vector control method which controls torque of the induction machine 290 using the torque as a reference without employing a sensor for measuring a position of a rotor of the induction machine 290.

The induction machine system including the current reference correction apparatus 100 according to one embodiment of the present disclosure will be described in detail.

The current reference generation unit 210 generates a q-axis current reference $i_{qs}^{e}$ and a d-axis current reference $i_{ds}^{e}$ on a synchronous reference frame based on a torque reference $T_e$ that is input to the induction machine system.

The current reference correction apparatus 100 according to one embodiment of the present disclosure is connected between the current reference generation unit 210 of the induction machine system and the current controller 220 thereof.

The current reference correction apparatus 100 corrects the q-axis and d-axis current references $i_{qs}^{e}$ and $i_{ds}^{e}$, which are generated from the current reference generation unit 210 using a correction factor K, on the synchronous reference frame, and outputs the corrected q-axis and d-axis current references $i_{qs}^{e*}$ and $i_{ds}^{e*}$ on the synchronous reference frame to the current controller 220.

The current controller 220 compares q-axis and d-axis currents $i_{qs}^{e}$ and $i_{ds}^{e}$, which are converted from phase currents $i_{as}$, $i_{bs}$, and $i_{cs}$ of the induction machine 290, on the synchronous reference frame, with the q-axis and d-axis current references $i_{qs}^{e*}$ and $i_{ds}^{e*}$, which are corrected from the current reference correction apparatus 100, on the synchronous reference frame to output q-axis and d-axis voltages $V_{qs}^{e*}$ and $V_{ds}^{e*}$ on the synchronous reference frame.

The two-phase current converter 230 converts the phase currents $i_{as}$, $i_{bs}$, and $i_{cs}$ of the induction machine 290 into q-axis and d-axis currents $i_{qs}^{s}$ and $i_{ds}^{s}$ on a stationary reference frame, and the current resolver 240 converts the q-axis and d-axis currents $i_{qs}^{s}$ and $i_{ds}^{s}$, which are converted from the two-phase current converter 230, on the stationary reference frame into q-axis and d-axis currents $i_{qs}^{e}$ and $i_{ds}^{e}$ on the synchronous reference frame to output the q-axis and d-axis currents $i_{qs}^{e}$ and $i_{ds}^{e}$ to the current controller 220.

The voltage resolver 250 converts the q-axis and d-axis voltages $V_{qs}^{e*}$ and $V_{ds}^{e*}$, which are output from the current controller 220, on the synchronous reference frame into q-axis and d-axis voltages $V_{qs}^{s*}$ and $V_{ds}^{s*}$ on the stationary reference frame. Thereafter, the three-phase voltage converter 260 converts the q-axis and d-axis voltages $V_{qs}^{s*}$ and $V_{ds}^{s*}$, which are converted from the voltage resolver 250, on the stationary reference frame into three-phase voltages $V_{as}$, $V_{bs}$, and $V_{cs}$ on the stationary reference frame to output the three-phase voltages $V_{as}$, $V_{bs}$, and $V_{cs}$.

The inverter 270 receives the three-phase voltages $V_{as}$, $V_{bs}$, and $V_{cs}$ output from the three-phase voltage converter 260 and applies the received three-phase voltages $V_{as}$, $V_{bs}$, and $V_{cs}$ to the induction machine 290 to control torque thereof.

The rotor speed and position estimator 280 estimates a rotor speed and a rotor position of the induction machine 290 using the phase currents $i_{as}$, $i_{bs}$, and $i_{cs}$ of the induction machine 290 and the q-axis and d-axis voltages $V_{qs}^{s*}$ and $V_{ds}^{s*}$, which are converted from the voltage resolver 250, on the stationary reference frame.

Meanwhile, when correcting a current reference using a correction factor K, the current reference correction apparatus 100 according to one embodiment of the present disclosure may differently calculate the correction factor K according to the torque reference $T_e$ that is input to the induction machine system, and correct the current reference to allow the corrected current reference to satisfy a rated operating condition of an induction machine.

That is, in response to variation of the torque reference $T_e$ that is input to the induction machine system, the current reference correction apparatus 100 may calculate the correction factor K to allow the current reference to satisfy the rated operating condition.

The current reference correction apparatus 100 will be described in more detail.

Figure 2:
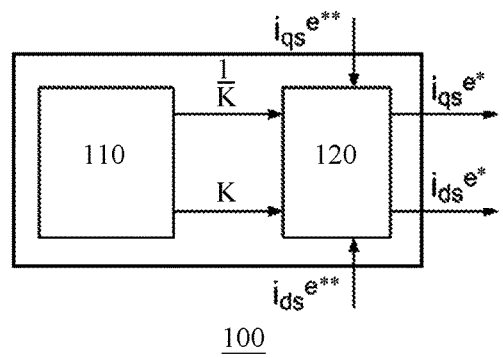
FIG. 2 is a diagram illustrating a configuration of the current reference correction apparatus according to one embodiment of the present disclosure.
Figure 3:
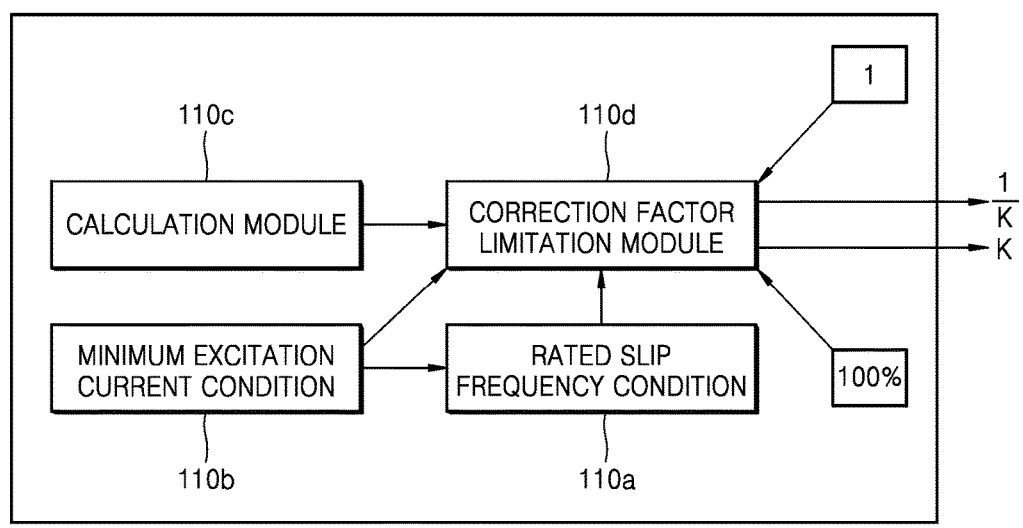
FIG. 3 is a diagram illustrating a detailed configuration of a calculation unit included in the current reference correction apparatus according to one embodiment of the present disclosure.

FIG. 2 is a diagram illustrating a configuration of the current reference correction apparatus 100 according to one embodiment of the present disclosure, and FIG. 3 is a diagram illustrating a detailed configuration of a calculation unit 110 included in the current reference correction apparatus 100 according to one embodiment of the present disclosure.

Referring to FIGS. 2 and 3, the current reference correction apparatus 100 includes the calculation unit 110 and a correction unit 120.

The calculation unit 110 sets a first torque reference section and a second torque reference section using candidate values of a correction factor that corrects a current reference to satisfy the rated operating condition of the induction machine.

Here, the rated operating condition may be a condition for operating the induction machine while operation circumstance is maintained within one range among a current range, a voltage range, a slip frequency range, and an excitation current range which are permitted to the induction machine when the induction machine is operated.

For example, the rated operating condition may include one or more conditions among a rated current limitation condition, a rated voltage limitation condition, a rated slip frequency condition, and a minimum excitation current condition.

The rated current limitation condition may be a condition in which a phase current of the induction machine is maintained to be equal to or less than a preset current value.

The rated voltage limitation condition may be a condition in which a voltage applied to the induction machine is maintained at a preset voltage value.

The rated slip frequency condition may be a condition in which a slip frequency of the induction machine is maintained to be equal to or less than a preset frequency ratio with respect to a rated slip frequency of the induction machine.

The minimum excitation current condition may be a condition in which a minimum excitation current of the induction machine is maintained to be equal to or greater than a preset current ratio with respect to a rated excitation current of the induction machine.

Meanwhile, the candidate value of the correction factor, which corrects a current reference to satisfy a rated operating condition, may be different according to a kind of the rated operating condition and a torque reference.

For example, the candidate value of the correction factor, which corrects a current reference to satisfy a rated slip frequency condition among the rated operating conditions, may be different according to a torque reference input to the induction machine system.

More particularly, when a torque reference input to the induction machine system is 80%, a candidate value of the correction factor, which corrects a current reference to satisfy a rated slip frequency condition, may be 0.7 to 2.2, and when a torque reference being input is 50%, a candidate value of the correction factor may be 0.5 to 2.2.

As shown in FIG. 3, the calculation unit 110 according to one embodiment calculates a torque reference, which is obtained when a minimum value of candidate values of a correction factor satisfying a rated slip frequency condition 110a of the induction machine among rated operating conditions is the same as a minimum value of candidate values of a correction factor satisfying a minimum excitation current condition 110b, as a criterion torque reference.

As described above, the candidate values of the correction factor are different according to the kind of the rated operating condition and the torque reference input to the induction machine system. At this point, the calculation unit 110 calculates the torque reference, which is obtained when minimum values are the same as each other among candidate values of correction factors satisfying all the rated slip frequency condition 110a and the minimum excitation current condition 110b, as the criterion torque reference.

At this point, the calculation unit 110 may calculate the criterion torque reference using the following Equation 1:

$$T_{e,ref} = 2 \times K_{c1,min}^2 \times 100$$

$$K_{c1,min} = a \qquad \text{[Equation 1]}$$

where $T_{e,ref}$ may be the criterion torque reference, $K_{c1,min}$ may be the minimum value of the correction factor satisfying the minimum excitation current condition of the induction machine, and a may be a preset current ratio between a minimum excitation current of the induction machine and a rated excitation current thereof in the minimum excitation current condition of the induction machine.

For example, when a preset current ratio between a minimum excitation current and a rated excitation current of the induction machine is 30:100, the calculation unit 110 may calculate a minimum value of a correction factor satisfying the minimum excitation current condition of the induction machine as 0.3 according to a preset minimum excitation current condition of the induction machine, and a criterion torque reference as 18% using Equation 1 described above.

Figure 4:
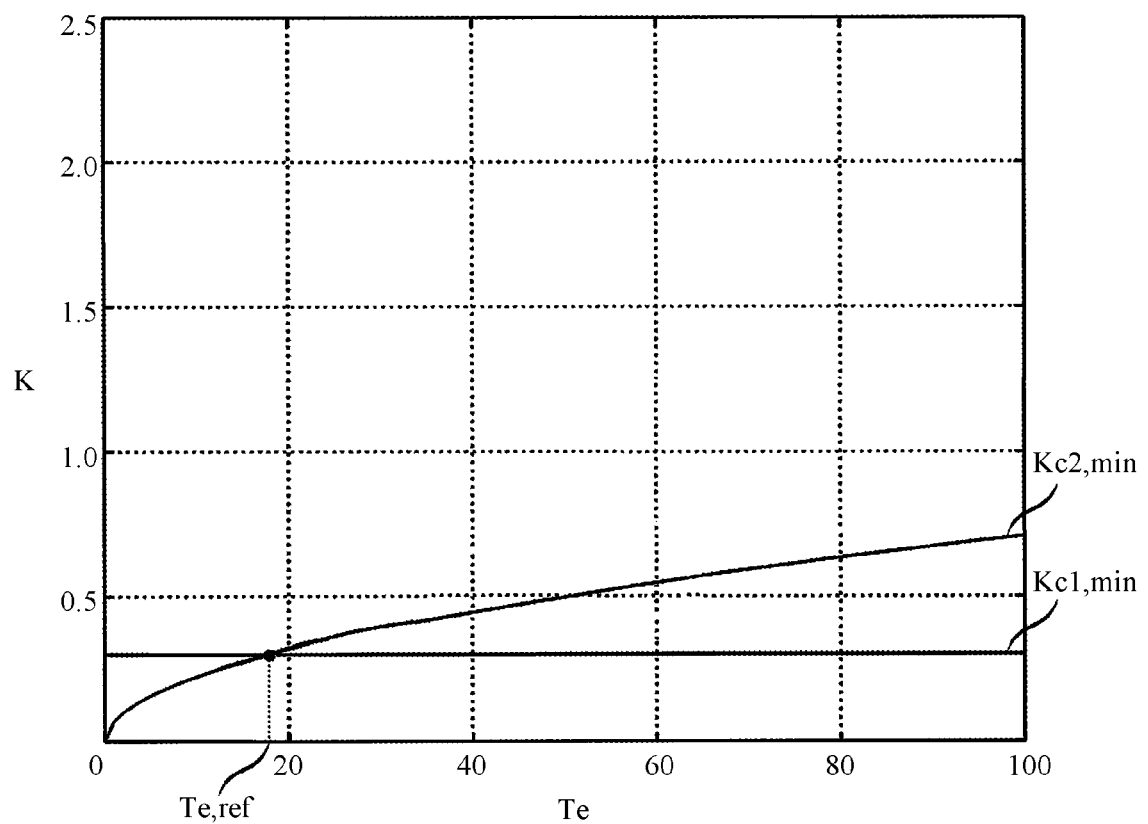
FIG. 4 is a graph illustrating a correction factor satisfying a rated slip frequency condition and a minimum excitation current condition of an induction machine according to a torque reference.

FIG. 4 is a graph illustrating a correction factor satisfying the rated slip frequency condition 100a and the minimum excitation current condition 100b of the induction machine according to the torque reference.

As shown in FIG. 4, a minimum value $K_{c2,min}$ of a correction factor satisfying the rated slip frequency condition 100a of the induction machine and a minimum value $K_{c1,min}$ of a correction factor satisfying the minimum excitation current condition 100b of the induction machine among the rated operating conditions are shown according to the torque reference $T_e$ being input to the induction machine system.

At this point, as described above, the calculation unit 110 may calculate the criterion torque reference $T_{e,ref}$ using Equation 1 based on the torque reference $T_e$ when minimum values are the same as each other among candidate values of correction factors satisfying all the rated slip frequency condition 100a and the minimum excitation current condition 100b.

Thereafter, the calculation unit 110 sets a torque reference section less than the criterion torque reference $T_{e,ref}$ to a first torque reference section $T_{e1}$, and a torque reference section equal to or greater than the criterion torque reference $T_{e,ref}$ to a second torque reference section $T_{e2}$ using the calculated criterion torque reference $T_{e,ref}$.

When the torque reference $T_e$ being input to the induction machine system is included in the first torque reference section $T_{e1}$, the calculation unit 110 calculates the minimum value $K_{c1,min}$ among the candidates of the correction factors satisfying the minimum excitation current condition 100b of the induction machine as a correction factor K.

At this point, the calculation unit 110 calculates the correction factor K at the first torque reference section $T_{e1}$ using the following Equation 2:

$$K = K_{c1,min}$$

$$(0 < T_e < T_{e,ref}) \qquad \text{[Equation 2]}$$

where K is the correction factor, $K_{c1,min}$ is the minimum value of the correction factor satisfying a minimum excitation current condition of the induction machine, $T_e$ is the torque reference, and $T_{e,ref}$ is the criterion torque reference.

As described above, the minimum value of the correction factor satisfying the minimum excitation current condition of the induction machine may be a preset current ratio between a minimum excitation current of the induction machine and a rated excitation current thereof under the minimum excitation current condition thereof.

On the other hand, when the torque reference $T_e$ being input to the induction machine system is included in the second torque reference section $T_{e2}$, the calculation unit 110 calculates a correction factor K in proportion to the torque reference $T_e$.

At this point, the calculation unit 110 calculates the correction factor K at the second torque reference section $T_{e2}$ using the following Equation 3:

$$K = \frac{1 - K_{c1,min}}{1 - 2K_{c1,min}^2} \times T_e \times 0.01 + \left(1 - \frac{1 - K_{c1,min}}{1 - 2K_{c1,min}^2}\right) \qquad \text{[Equation 3]}$$

$$(T_{e,ref} \le T_e \le 100)$$

where K is the correction factor, $K_{c1,min}$ is the minimum value of the correction factor satisfying the minimum excitation current condition of the induction machine, $T_e$ is the torque reference, and $T_{e,ref}$ is the criterion torque reference.

Meanwhile, the calculation unit 110 may include a calculation module 110c for calculating Equation 3 described above.

As in Equation 3 described above, when the torque reference $T_e$ being input to the induction machine system is included in the second torque reference section $T_{e2}$, the minimum value of the correction factor, which is calculated in the calculation unit 110, may be the correction factor calculated at the first torque reference section $T_{e1}$ and the maximum value may be "1."

Using the calculated criterion torque reference $T_{e,ref}$, the calculation unit 110 according to another embodiment of the present disclosure sets a torque reference section equal to or less than the criterion torque reference $T_{e,ref}$ to the first torque reference section $T_{e1}$, and a torque reference section exceeding the criterion torque reference $T_{e,ref}$ to the second torque reference section $T_{e2}$.

Consequently, when the torque reference $T_e$ being input to the induction machine system is the same as the criterion torque reference $T_{e,ref}$, the calculation unit 110 according to another embodiment of the present disclosure calculates the correction factor K based on the minimum value $K_{c1,min}$ among candidate values of the correction factor satisfying the minimum excitation current condition 100b.

As such, when the torque reference $T_e$ is the same as the criterion torque reference $T_{e,ref}$, the calculation unit 110 according to another embodiment of the present disclosure may simply calculate the correction factor K by calculating only the minimum excitation current condition 100b without calculating a second order formula of Equation 3 described above.

Figure 5:
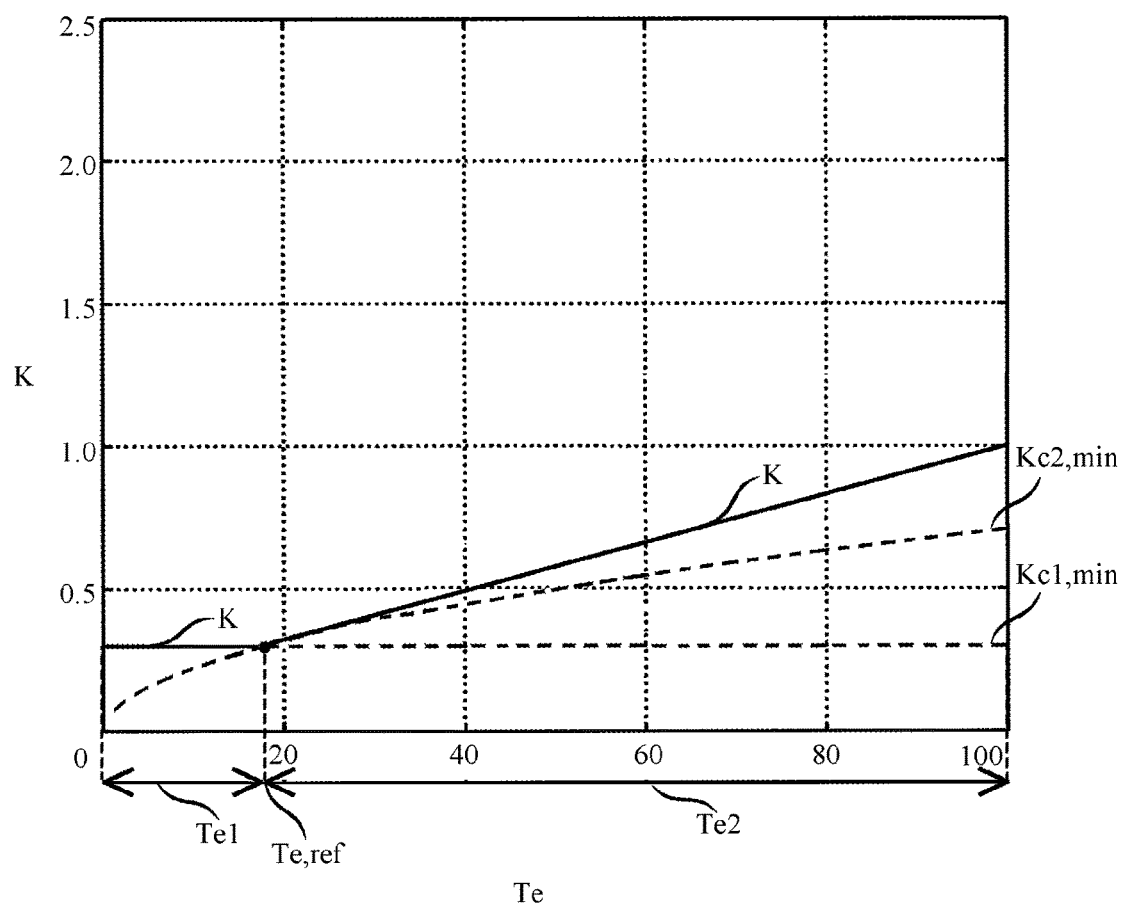
FIG. 5 is a graph illustrating a correction factor, which is calculated from the current reference correction apparatus according to one embodiment of the present disclosure, according to a torque reference.

FIG. 5 is a graph illustrating a correction factor, which is calculated from the current reference correction apparatus 100 according to one embodiment of the present disclosure, according to a torque reference.

As shown in FIG. 5, the correction factor K calculated from the calculation unit 110 is calculated based on the minimum value $K_{c1,min}$ among candidate values of the correction factor satisfying the minimum excitation current condition of the induction machine, at the first torque reference section $T_{e1}$ less than the criterion torque reference $T_{e,ref}$.

Also, the correction factor K calculated from the calculation unit 110 has a minimum value and a maximum value as a correction factor calculated from the first torque reference section $T_{e1}$ and "1," respectively, and is calculated in proportion to the torque reference $T_e$.

As such, the calculation unit 110 may simply calculate the correction factor using one of Equations 2 and 3 described above according to a torque reference section in which the input torque reference is included without calculating a correction factor satisfying all the rated current limitation condition, the rated voltage limitation condition, the rated slip frequency condition, and the minimum excitation current condition in real time.

Meanwhile, the calculation unit 110 may further include a correction factor limitation module 110d, and the correction factor limitation module 110d may calculate a correction factor by limiting candidate values of the correction factor satisfying the rated slip frequency condition 100a and the minimum excitation current condition 100b.

The correction unit 120 corrects a current reference generated from the current reference generation unit 210 of the induction machine system using the correction factor calculated from the calculation unit 110.

More particularly, the correction unit 120 corrects the current reference by multiplying the q-axis current reference $i_{qs}^{e**}$ on the synchronous reference frame, which is generated from the current reference generation unit 210, by an inverse number of the correction factor K.

Also, the correction unit 120 corrects the current reference by multiplying the d-axis current reference $i_{ds}^{e**}$ on the synchronous reference frame, which is generated from the current reference generation unit 210, by the correction factor K.

At this point, the correction unit 120 corrects the current reference generated from the current reference generation unit 210 using the following Equation 4:

$$i_{qs}^{e*} = i_{qs}^{e**} \times \frac{1}{K}$$
$$i_{ds}^{e*} = i_{ds}^{e**} \times K$$
[Equation 4]

where $i_{qs}^{e**}$ is the q-axis current reference on the synchronous reference frame before correction, $i_{qs}^{e*}$ is the q-axis current reference of the synchronous reference frame after correction, $i_{ds}^{e**}$ is the d-axis current reference on the synchronous reference frame before correction, $i_{ds}^{e*}$ is the d-axis current reference on the synchronous reference frame after correction, and K is the correction factor.

Thereafter, the induction machine system may control a torque of the induction machine 290 to satisfy the rated operating condition using the corrected current reference.

Although the present disclosure has been described with reference to the embodiments, it should be understood that numerous other substitutions, modifications and alterations can be devised by those skilled in the art without departing the technical spirit of this disclosure, and thus it should be construed that the present disclosure is not limited by the embodiments described above and the accompanying drawings.

What is claimed is:

1. An apparatus for correcting a current reference generated based on a torque reference being input to an induction machine system so as to control torque of an induction machine, comprising:

a calculation unit configured to set a first torque reference section and a second torque reference section using a correction factor that corrects the current reference so as to enable the current reference to satisfy rated operating conditions of the induction machine, and calculate the correction factor according to a torque reference section, in which the torque reference being input to the induction machine system is included, of the first torque reference section and the second torque reference section; and a correction unit configured to correct the current reference using the correction factor;

wherein the calculation unit calculates the torque reference when a minimum value of the correction factor satisfying a rated slip frequency condition of the induction machine among the rated operating conditions is the same as that of the correction factor satisfying a minimum excitation current condition of the induction machine among the rated operating conditions, as a criterion torque reference;

wherein the calculation unit sets the torque reference section less than the criterion torque reference to the first torque reference section, and the torque reference section equal to or greater than the criterion torque reference to the second torque reference section, wherein the calculation unit calculates a minimum value of the correction factor satisfying the minimum excitation current condition of the induction machine as the correction factor when the torque reference is included in the first torque reference section;

wherein the calculation unit calculates the correction factor in proportion to the torque reference when the torque reference is included in the second torque reference section.

2. The apparatus of claim 1, wherein the calculation unit calculates the criterion torque reference using the following Equation:

$$T_{e,ref} = 2 \times K_{c1,min}^2 \times 100,$$

wherein $T_{e,ref}$ is the criterion torque reference, and $K_{c1,min}$ is the minimum value of the correction factor satisfying the minimum excitation current condition of the induction machine.

3. The apparatus of claim 1, wherein the calculation unit, when the torque reference is included in the first torque reference section, calculates the correction factor using the following equation:

$$K = K_{c1,min}$$

$$(0 < T_e < T_{e,ref}),$$

wherein K is the correction factor, $K_{c1,min}$ is the minimum value of the correction factor satisfying the minimum excitation current condition of the induction machine, $T_e$ is the torque reference, and $T_{e,ref}$ is the criterion torque reference.

4. The apparatus of claim 1, wherein the calculation unit, when the torque reference is included in the second torque reference section, calculates the correction factor using the following equation:

$$K = \frac{1 - K_{c1,min}}{1 - 2K_{c1,min}^2} \times T_e \times 0.01 + \left(1 - \frac{1 - K_{c1,min}}{1 - 2K_{c1,min}^2}\right),$$

$$(T_{e,ref} \le T_e \le 100),$$

wherein K is the correction factor, $K_{c1,min}$ is the minimum value of the correction factor satisfying the minimum excitation current condition of the induction machine, $T_e$ is the torque reference, and $T_{e,ref}$ is the criterion torque reference.

* * * * *